(12) United States Patent
Kim et al.

(10) Patent No.: US 8,921,192 B2
(45) Date of Patent: Dec. 30, 2014

(54) SEMICONDUCTOR DEVICES AND METHODS OF FABRICATING THE SAME

(75) Inventors: Dong Hyuk Kim, Seongnam-si (KR); Hoi Sung Chung, Hwaseong-si (KR); Myungsun Kim, Hwaseong-si (KR); Dongsuk Shin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 152 days.

(21) Appl. No.: 13/615,825

(22) Filed: Sep. 14, 2012

(65) Prior Publication Data

US 2013/0109144 A1    May 2, 2013

(30) Foreign Application Priority Data

Oct. 26, 2011   (KR) .......................... 10-2011-0110109

(51) Int. Cl.
*H01L 21/336* (2006.01)
*H01L 29/66* (2006.01)
*H01L 21/02* (2006.01)
*H01L 29/78* (2006.01)
*H01L 29/165* (2006.01)

(52) U.S. Cl.
CPC .... *H01L 29/66636* (2013.01); *H01L 21/02532* (2013.01); *H01L 21/02579* (2013.01); *H01L 21/0262* (2013.01); *H01L 29/7834* (2013.01); *H01L 29/7848* (2013.01); *H01L 29/165* (2013.01)
USPC   438/301; 438/478; 257/E21.09; 257/E21.409

(58) Field of Classification Search
USPC .................... 438/301, 341, 478; 257/E21.09, 257/E21.409
See application file for complete search history.

(56) References Cited

U.S. PATENT DOCUMENTS

| 6,589,849 | B1 * | 7/2003 | Lee ............................ 438/341 |
| 7,544,997 | B2 | 6/2009 | Zhang et al. |
| 2004/0212024 | A1 * | 10/2004 | Oh et al. ....................... 257/396 |
| 2005/0104055 | A1 * | 5/2005 | Kwak et al. ...................... 257/2 |
| 2007/0235802 | A1 | 10/2007 | Chong et al. |

FOREIGN PATENT DOCUMENTS

JP       2007-165665       6/2007

\* cited by examiner

*Primary Examiner* — Charles Garber
*Assistant Examiner* — Abdulfattah Mustapha
(74) *Attorney, Agent, or Firm* — Volentine & Whitt, PLLC

(57) ABSTRACT

A MOS transistor includes a pair of impurity regions formed in a substrate as spaced apart from each other, and a gate electrode formed on a region of the substrate located between the pair of impurity regions. Each of the impurity regions is formed of a first epitaxial layer, a second epitaxial layer on the first epitaxial layer, and a third epitaxial layer on the second epitaxial layer. The first epitaxial layer is formed of at least one first sub-epitaxial layer and a respective second sub-epitaxial layer stacked on each first sub-epitaxial layer. An impurity concentration of the first sub-epitaxial layer is less than that of the second sub-epitaxial layer.

12 Claims, 10 Drawing Sheets

SEMICONDUCTOR DEVICES AND METHODS OF FABRICATING THE SAME

PRIORITY STATEMENT

This U.S. non-provisional patent application claims priority under 35 U.S.C. §119 to Korean Patent Application No. 10-2011-0110109, filed on Oct. 26, 2011, the entirety of which is hereby incorporated by reference.

BACKGROUND

1. Technical Field

The inventive concept relates to semiconductor devices and methods of fabricating the same. More particularly, the inventive concept relates to metal-oxide-semiconductor (MOS) transistors and methods of fabricating the same.

2. Description of Related Art

There is an ever increasing demand for more highly integrated and higher performance semiconductor devices. In this respect, metal-oxide-semiconductor (MOS) transistors constituting semiconductor devices are continuously being scaled down. For example, the thickness of gate insulation layers of MOS transistors and the channel length of the MOS transistors are being minimized in an attempt to maximize the density of integration and performance of semiconductor devices. In particular, reducing the thickness of the gate insulation layers of the MOS transistors and the channel length of the MOS transistors results in an increase in the mobility of carriers (e.g., electrons or holes) of the MOS transistors and thus, an increase in the operating speed of the semiconductor devices. However, small channel lengths of the MOS transistors sometimes give rise to a so-called short channel effect, and thin gate insulation layers may allow for excessive gate leakage current. To suppress such a short channel effect, the channel of a MOS transistor may be formed with a high concentration of impurities. However, in this case, the carrier mobility in the channel region is compromised by the impurities in the channel region because the greater the concentration of the impurities the lower the carrier mobility. Therefore, the switching speed of the MOS transistors is impeded even though the channel length is kept to a minimum.

SUMMARY

According to one aspect of the inventive concept, there is provided a semiconductor device including a substrate, a pair of impurity regions spaced apart from each other in the substrate, and a gate electrode disposed on the substrate at a location between the pair of impurity regions in a first direction, and in which each of the impurity regions includes a first epitaxial layer, a second epitaxial layer on the first epitaxial layer, and a third epitaxial layer on the second epitaxial layer, the first epitaxial layer is a stack of alternately disposed first and second sub-epitaxial layers (at least one each), and a concentration of an impurity in material constituting the first sub-epitaxial layer(s) is less than a concentration of an impurity in material constituting the second sub-epitaxial layer(s).

According another aspect of the inventive concept, there is provided a method of fabricating a semiconductor device which includes etching a substrate to form a recess therein, forming a first epitaxial layer on wall surfaces delimiting sides and the bottom of the recess, and sequentially forming a second epitaxial layer and a third epitaxial layer on the first epitaxial layer, and in which the first epitaxial layer is formed by sequentially forming (at least one time) a first sub-epitaxial layer and a second sub-epitaxial layer in such a way that a concentration of an impurity of material constituting the first sub-epitaxial layer is less than a concentration of an impurity of material constituting the second sub-epitaxial layer.

According to still another aspect of the inventive concept, there is provided a method of fabricating a MOS transistor which includes forming a gate insulating layer and a gate electrode layer on an active region of a substrate, etching the active region of the substrate to form recesses therein on opposite sides of a channel region, filling the recesses epitaxially with material whose lattice constant is greater than that of the channel region to form source/drain regions that apply stress to the channel region and in which the filling of the recesses is performed by forming a first epitaxial layer that extends along surfaces delimiting the sides and bottoms of the recesses, to such a thickness as to leave upper parts of the recesses unfilled, then forming a second epitaxial layer on the first epitaxial layer to such a thickness as to at least fill what remains of the recesses and subsequently annealing the substrate.

BRIEF DESCRIPTION OF THE DRAWINGS

The above and other features and advantages of the inventive concept will become more apparent in view of the attached drawings and accompanying detailed description of the preferred embodiments.

DETAILED DESCRIPTION OF THE PREFERRED EMBODIMENTS

Figure 1:
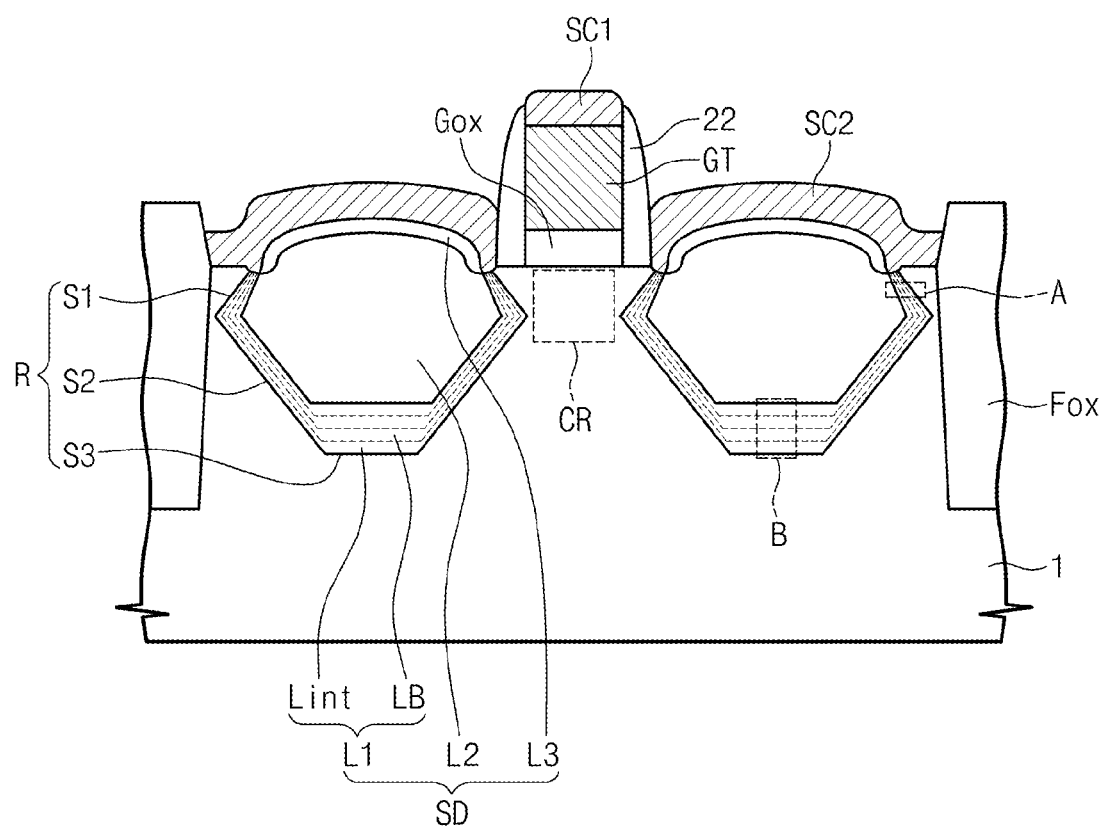
FIG. 1 is a cross-sectional view of a metal-oxide-semiconductor (MOS) transistor of a semiconductor device according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. Furthermore, the word or term "wall" is used synonymously at times with the word "surface".

An embodiment of a metal-oxide-semiconductor (MOS) transistor of a semiconductor device according to the inventive concept will now be described with reference to FIGS. 1, 2A and FIG. 2B.

Referring first to FIG. 1, in this example, an isolation layer Fox is disposed in a substrate 1 to define an active region. The substrate 1 may be a single crystalline silicon substrate. Also, the substrate 1 may be doped with impurities, for example, N-type impurities. A gate electrode GT is disposed on the substrate 1. The gate electrode GT may include at least one of a doped polysilicon layer and a metal containing layer. A gate insulation layer Gox is interposed between the gate electrode GT and the substrate 1. A first silicide layer SC1 may be disposed at the top of the gate electrode GT. Furthermore, a spacer 22 may be disposed on sidewalls of the gate electrode GT.

The MOS transistor also has a pair of spaced apart impurity regions SD in the active region of the substrate 1, for example. More specifically, in this embodiment, the impurity regions SD are disposed in respective ones of recessed regions R of the substrate 1. Each of the recessed regions R includes opposing first sidewalls S1, opposing second sidewalls S2 and a bottom surface S3 together delimiting a recess in the active region of the substrate 1. Each of the first and second sidewalls S1 and S2 extends vertically, and the first sidewalls S1 adjoin the second sidewalls S2, respectively. Thus, each pair of adjoining first and second sidewalls S1 and S2 may be seen as together constituting a respective side of the recessed region R.

Furthermore, in the example illustrated in FIG. 1, each first sidewall S1 is disposed above a second sidewall wall S2 and the second sidewall S2 may be connected to an edge of the bottom surface S3. Also, the distance between the opposing first sidewalls S1 gradually increases in a direction toward the bottom surface S3, whereas the distance between the opposing second sidewalls S2 gradually decreases in a direction toward the bottom surface S3. Accordingly, the first and second sidewalls S1 and S2 may have a (111) planar orientation and the bottom surface S3 may have a (100) planar orientation.

The gate electrode GT is disposed on that part of the active region which extends between the impurity regions SD.

Referring again to FIG. 1, each of the impurity regions SD includes a first epitaxial layer L1, a second epitaxial layer L2 and a third epitaxial layer L3. The first epitaxial layer L1 is made up of at least one pair of sub-epitaxial layers Lint and LB. Specifically, the first epitaxial layer L1 includes at least one first sub-epitaxial layer Lint and at least one second sub-epitaxial layer LB which are alternately disposed one atop the other in a stack. The first sub-epitaxial layer Lint is an intrinsic semiconductor epitaxial layer that is not doped with impurities. For example, the first sub-epitaxial layer Lint may be an undoped silicon-germanium epitaxial layer. The second sub-epitaxial layer LB is an in-situ doped semiconductor epitaxial layer. For example, the second sub-epitaxial layer LB may be a silicon-germanium epitaxial layer doped in-situ with boron impurities. In the case in which the first epitaxial layer L1 includes a plurality of first sub-epitaxial layers Lint and a plurality of second sub-epitaxial layers LB, a respective first sub-epitaxial layer Lint is interposed between the second sub-epitaxial layers LB of each adjacent pair thereof in the stack, and another first sub-epitaxial layer Lint is interposed between the lowermost second sub-epitaxial layer LB and the substrate 1. Also, in an example of this embodiment, another respective first sub-epitaxial layer Lint is interposed between the uppermost second sub-epitaxial layer LB and the second epitaxial layer L2.

Also, in this example, the second epitaxial layer L2 is an in-situ doped semiconductor epitaxial layer. For example, the second epitaxial layer L2 may be a silicon-germanium epitaxial layer doped in-situ with boron impurities. The boron concentration of the second epitaxial layer L2 is preferably within the range of about $2.2 \times 10^{19}$ boron atoms/cm$^3$. Moreover, in this case, the boron concentration of the second epitaxial layer L2 is greater than that of the second sub-epitaxial layer LB.

In addition, the content of germanium in the second epitaxial layer L2 may be greater than the content of germanium in the first epitaxial layer L1. For example, the second epitaxial layer L2 may have a germanium content of about 35% in terms of atomic percent, and the first epitaxial layer L1 may have a germanium content of about 25% in terms of atomic percent. Also, the top surface of the second epitaxial layer L2 may be located at a level above that of the top surface of the substrate 1.

The third epitaxial layer L3 may be an in-situ doped semiconductor layer or an undoped semiconductor layer. For example, the third epitaxial layer L3 is a silicon epitaxial layer doped in-situ with boron impurities. Furthermore, a second silicide layer SC2 may be disposed on each of the third epitaxial layers L3.

The MOS transistor shown in FIG. 1 may be a P-channel MOS transistor.

The portion of the substrate 1 under the gate electrode GT is a channel region CR of the transistor. Each of the impurity regions SD adjacent to the channel regions CR includes a silicon-germanium epitaxial layer, and the lattice constant of the silicon-germanium layer is greater than that of the channel region CR (a region of the silicon substrate 1). Thus, a compressive stress is applied to the channel region CR, such that the channel region CR has a strained silicon lattice structure. Accordingly, carrier mobility (e.g., hole mobility) in the channel region CR is, in effect, increased to improve the operating speed of the P-channel MOS transistor.

Figure 2A:
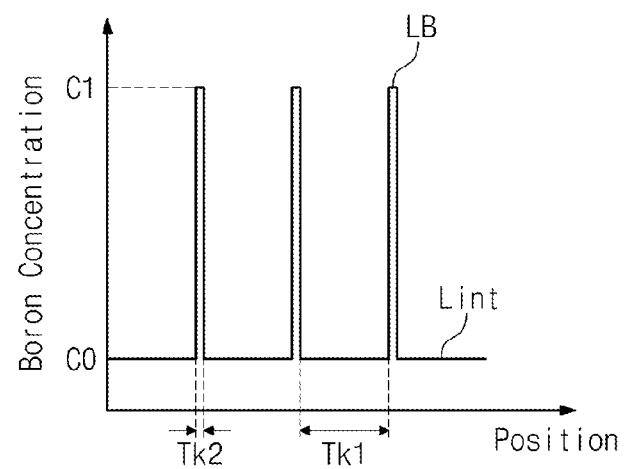
FIG. 2A is a graph of a boron concentration in a region 'A' of the device shown in FIG. 1.
Figure 2B:
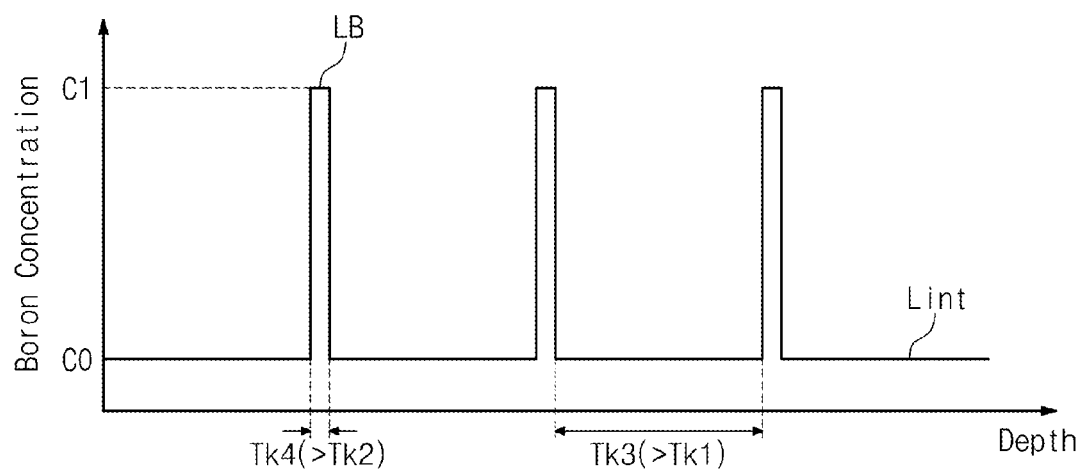
FIG. 2B is a graph of a boron concentration in a region 'B' of the device shown in FIG. 1.

Referring now to FIGS. 1, 2A and 2B, the thickness of the first epitaxial layer L1 on the first and second sidewalls S1 and S2 of the recessed region R is less than that of the first epitaxial layer L1 on the bottom surface S3 of the recessed region R. For example, the thickness of the first epitaxial layer L1 in a region 'A' of the device shown in FIG. 1 is at most about 50 angstroms (Å), and the thickness of the first epitaxial layer L1 in a region 'B' of the device shown in FIG. 1 is at least about 200 angstroms (Å). Also, referring to FIGS. 2A and 2B, the impurity concentration C0 of the first sub-epitaxial layer Lint is relatively low, e.g., is less than about $1\times10^{18}$ boron atoms/cm$^3$. In the present embodiment, for example, the first sub-epitaxial layer Lint is an intrinsic semiconductor layer having an impurity concentration close to zero. On the other hand, the impurity concentration C1 of the second sub-epitaxial layer LB is substantially greater than that C0 of the first sub-epitaxial layer Lint. For example, the impurity concentration C1 of the second sub-epitaxial layer LB is about $1\times10^{19}$ boron atoms/cm$^3$.

Also, in FIGS. 2A and 2B, Tk1 indicates the thickness (a first thickness) of the first sub-epitaxial layer Lint in the region 'A' of the device shown in FIG. 1, Tk2 designates the thickness (a second thickness) of the second sub-epitaxial layer LB in the region 'A', Tk3 designates the thickness (a third thickness) of the first sub-epitaxial layer Lint in the region 'B' of the device shown in FIG. 1, and Tk4 designates the thickness (a fourth thickness) of the second sub-epitaxial layer LB in the region 'B'. The first thickness Tk1 is greater than the second thickness Tk2, and the third thickness Tk3 is greater than the fourth thickness Tk4 in this embodiment. In addition, the third thickness Tk3 may be greater than the first thickness Tk1 and the fourth thickness Tk4 may be greater than the second thickness Tk2.

That is, in this embodiment, the first sub-epitaxial layer Lint disposed on the bottom surface S3 of the recessed region R has a relatively low impurity concentration and has a thickness greater than that of the first sub-epitaxial layer Lint disposed on the sidewalls S1 and S2. Thus, during the fabrication of the MOS transistor and in particular, during an annealing process, the impurities (e.g., boron atoms) in the second epitaxial layer L2 will diffuse into the first sub-epitaxial layers Lint. Accordingly, the impurity regions SD will have a graded junction profile in terms of their impurity concentration. Consequently, a junction leakage current of the impurity regions SD is minimized.

Meanwhile, the first sub-epitaxial layer Lint disposed on the sidewalls S1 and S2 of the recessed region R is thinner than the first sub-epitaxial layer Lint disposed on the bottom surface S3. Thus, the first sub-epitaxial layer Lint disposed on the sidewalls S1 and S2 hardly has any effect on increasing series resistance of the impurity regions SD. Consequently, any degradation of the current drivability of the MOS transistor by the first sub-epitaxial layer Lint is negligible.

Accordingly, a semiconductor device according to the inventive concept offers an improved leakage current characteristic and a high speed operation.

A method of manufacturing a semiconductor device according to the inventive concept will now be described with reference to FIGS. 3 to 9.

Figure 3:
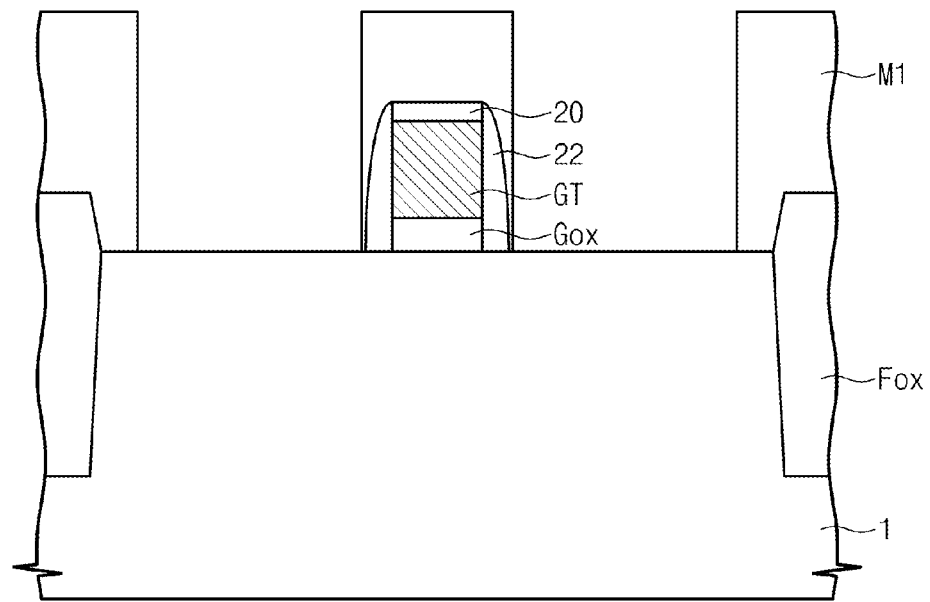
FIGS. 3, 4, 5A, 6, 7, 8 and 9 illustrate a method of fabricating a MOS transistor according to the inventive concept, and are each a cross-sectional of an intermediate structure formed during the method.

Referring first to FIG. 3, an isolation layer Fox is formed in a substrate 1 to define an active region. The substrate 1 may be a single crystalline silicon substrate or a silicon-on-insulator (SOI) substrate. The isolation layer Fox may be formed using a shallow trench isolation (STI) technique. A gate insulation layer Gox, a gate electrode GT and a capping layer 20 are then formed on the active region on the substrate 1. The capping layer 20 may be formed of at least one of a silicon oxide layer, a silicon oxynitride layer and a silicon nitride layer. The gate electrode GT may be formed of a doped polysilicon layer. Next, a spacer 22 is formed on sidewalls of the gate electrode GT. The spacer 22 may be formed of at least one of a silicon oxide layer, a silicon oxynitride layer and a silicon nitride layer. Subsequently, a mask pattern M1 is formed on the substrate 1 to cover the gate electrode GT and the isolation layer Fox. The mask pattern M1 may be a hard mask formed of a silicon nitride layer or a photoresist pattern. The mask pattern M1 has openings that define the impurity regions SD of FIG. 1.

Figure 4:
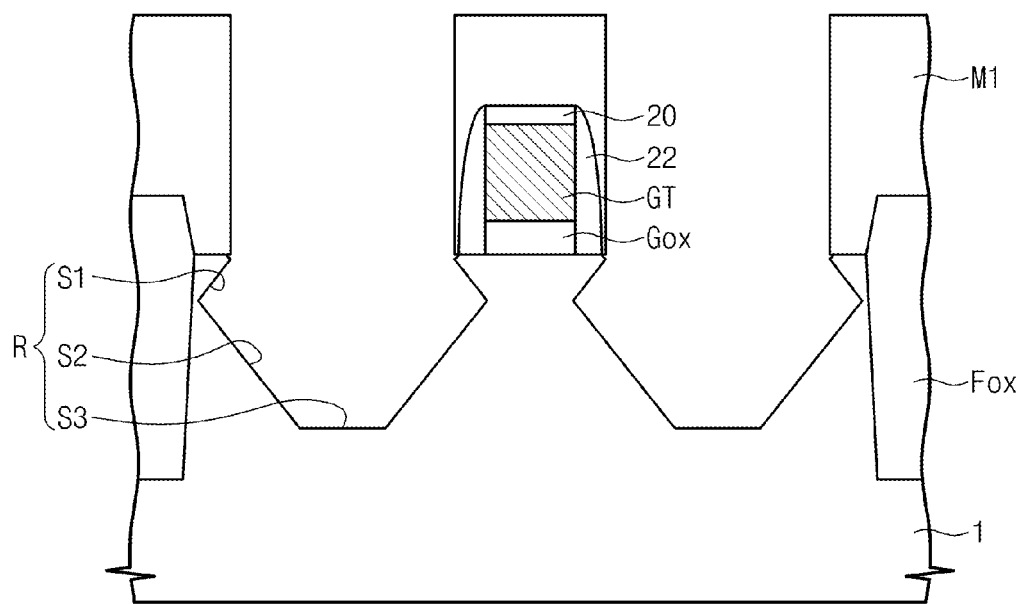

Referring to FIG. 4, the substrate 1 is etched using the mask pattern M1 as an etch mask, thereby forming recessed regions R in the substrate 1. In this embodiment, the etching of the substrate to form the recessed regions R comprises sequentially performing dry and wet etching processes. The wet etching process can be performed using an ammonium hydroxide or a tetra-methyl-ammonium-hydroxide (TMAH) solution as an etchant. As a result of etching the substrate 1 by performing the dry etching process followed by the wet etching process, recesses are formed in the substrate 1 each being delimited by first sidewalls S1, second sidewalls S2 and a bottom surface S3 (constituting a recessed region R). As was described above, the first and second sidewalls S1 and S2 have a (111) planar orientation, and the bottom surface S3 has a (100) planar orientation.

Figure 5A:
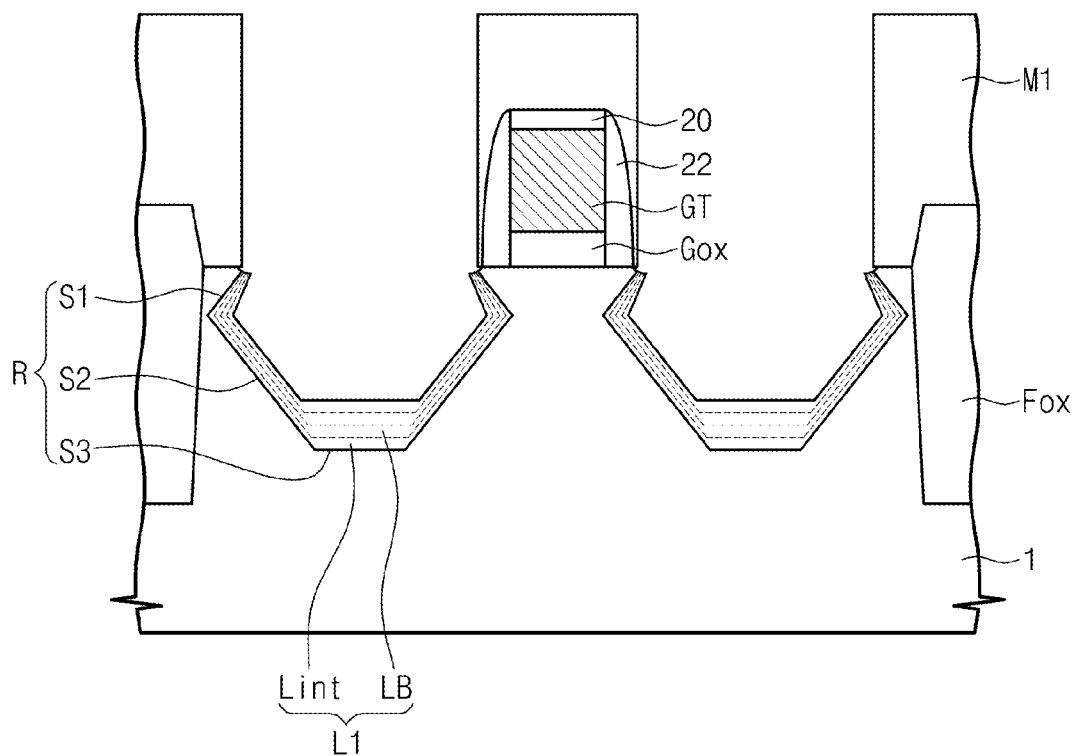
Figure 5B:
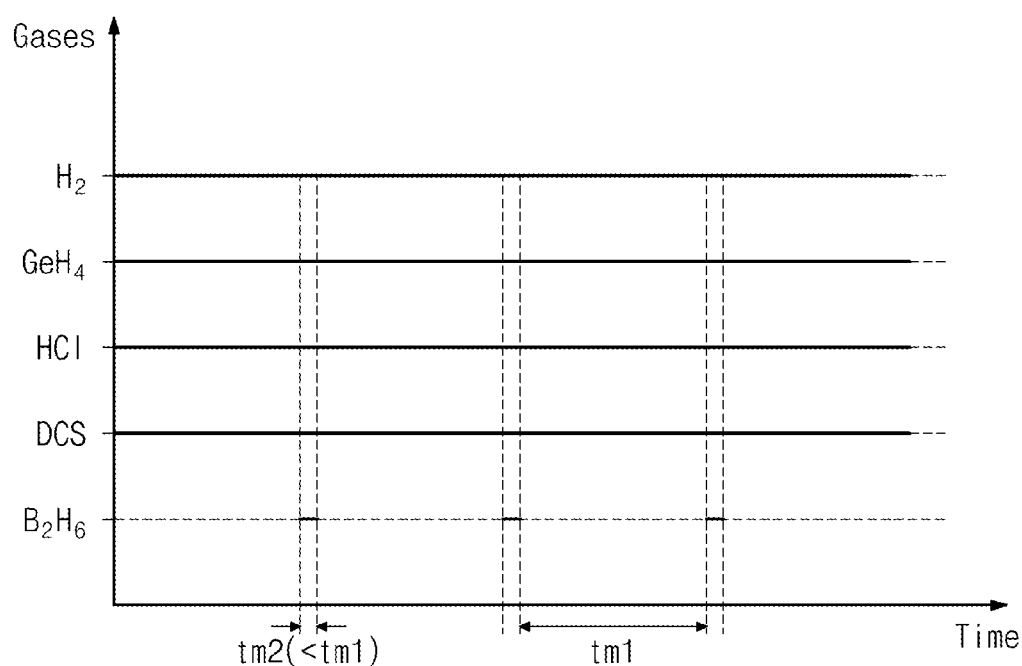
FIG. 5B is a timing diagram of supplying gases during a process of forming a first epitaxial layer shown in FIG. 5A.

Referring to FIGS. 5A and 5B, a first epitaxial layer L1 is formed on the first and second sidewalls S1 and S2 and the bottom surfaces S3 using an epitaxial growth process. If the mask pattern M1 is a photoresist pattern, the mask pattern M1 may be removed before the first epitaxial layer L1 is formed. In this embodiment, the first epitaxial layer L1 is formed using a modulation in-situ doping method. Specifically, the substrate 1 is loaded into a processing chamber, hydrogen ($H_2$), a germanium-based gas ($GeH_4$), gaseous hydrochloric acid (HCl) and dichlorosilane ($SiH_2Cl_2$, DCS) are continuously supplied into the process chamber, and diborane ($B_2H_6$) is periodically supplied into the process chamber as illustrated in FIG. 5B. Consequently, a first sub-epitaxial layer Lint and a second sub-epitaxial layer LB are alternately and repeatedly formed in the recessed region R. That is, the first sub-epitaxial layer Lint is formed during each phase in which only the hydrogen ($H_2$), the germanium-based ($GeH_4$) gas, the gaseous hydrochloric acid (HCl) and the DCS are supplied into the process chamber. On the other hand, the second sub-epitaxial layer LB is formed during each phase in which the diborane ($B_2H_6$) is additionally supplied into the process chamber. In some cases, silane ($SiH_4$) may be used instead of or in addition to the DCS.

Thus, the total time (tmt) for forming the first epitaxial layer L1, the time (tm1) of each phase of forming the first sub-epitaxial layer Lint of the first epitaxial layer L1, the time (tm2) of each phase of forming the second sub-epitaxial layer LB of the first epitaxial layer L1, and the number (Nr) of times that first and second sub-epitaxial layers Lint and LB are both formed may satisfy the following:

$$tmt=(tm1+tm2)\times Nr$$

The ratio of tm2 to tm1 (tm2/tm1) is preferably within a range of about 0.01 to about 0.5. For example, the first time (tm1) may be 1 second to 50 seconds, and the second time (tm2) may be 0.1 seconds to 5 seconds. The diborane ($B_2H_6$) may be supplied at a flow rate of about 1 standard cubic centimeters per minute (sccm) to about 300 sccm while the diborane ($B_2H_6$) is injected into the process chamber.

Also, the total time of the phase(s) during which the second sub-epitaxial layer(s) LB is/are formed using the diborane ($B_2H_6$) may equal Nr×tm2.

In one example of this embodiment, a first sub-epitaxial layer Lint is formed as the uppermost layer of the first epitaxial layer L1. That is, after at least one first sub-epitaxial layer Lint and at least one second sub-epitaxial layer LB are formed, another first sub-epitaxial layer Lint may be formed just before the second epitaxial layer L2 is formed. In this case, tmt=((tm1+tm2)×Nr)+tm2.

Also, the first epitaxial layer L1 tends to grow on the sidewalls S1 and S2 at a lower rate than on the bottom surface S3 because the sidewalls S1 and S2 have a (111) planar orientation whereas the bottom surface S3 has a (100) planar orientation. Thus, the first epitaxial layer L1 is formed more thinly on the sidewalls S1 and S2 than on the bottom surface S3.

Figure 6:
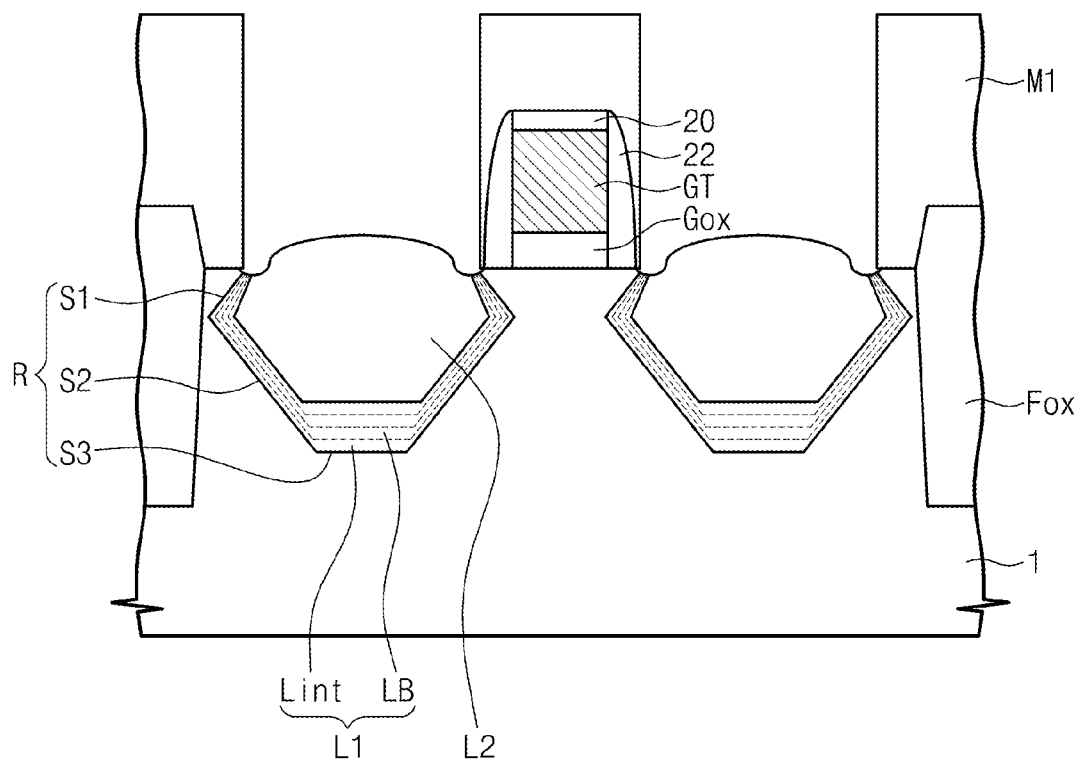

Referring to FIG. 6, second epitaxial layer L2 is formed on the first epitaxial layer L1. As was mentioned above, the second epitaxial layer L2 may be a silicon-germanium epitaxial layer doped with boron impurities. In the present embodiment, such second epitaxial layer L2 is formed by continuously supplying hydrogen ($H_2$), a germanium-based ($GeH_4$) gas, gaseous hydrochloric acid (HCl), dichlorosilane ($SiH_2Cl_2$, DCS) and diborane ($B_2H_6$) gas into the process chamber. Also, the second epitaxial layer L2 may be formed until it fills what remains of the recesses of the recessed regions R. The second epitaxial layer L2 may even be formed to protrude from a region of the substrate 1 (namely, from the active region).

As was described above, the first and second epitaxial layers L1 and L2 may each be formed of a silicon-germanium layer and the substrate 1 may be a silicon substrate. In this case, the lattice constants of the first and second epitaxial layers L1 and L2 are each greater than that of the substrate 1. Thus, a compressive stress is applied to a region that will form the channel region (region 'CR' in FIG. 1) of the device. As a result, the channel region CR will have a strained silicon lattice structure. Accordingly, carrier mobility is enhanced which facilitates a high speed operation.

Figure 7:
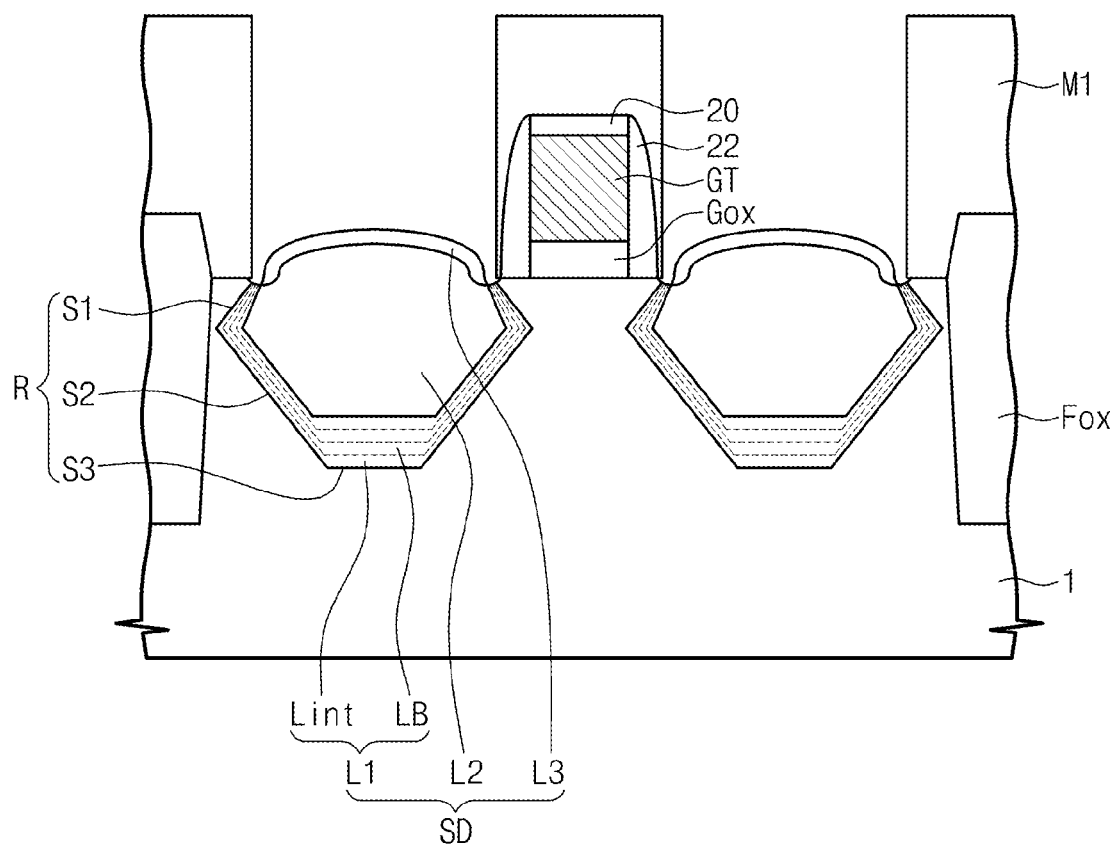

Referring to FIG. 7, a third epitaxial layer L3 is formed on the second epitaxial layer L3. The third epitaxial layer L3 may be formed by continuously supplying hydrogen ($H_2$), gaseous hydrochloric acid (HCl) and dichlorosilane ($SiH_2Cl_2$, DCS) into the process chamber. Also, during this process, a dopant gas, for example, diborane ($B_2H_6$), may or may not be supplied into the process chamber. That is, as was described above, the third epitaxial layer L3 may be a silicon epitaxial layer doped in-situ with boron impurities or an undoped silicon epitaxial layer.

Figure 8:
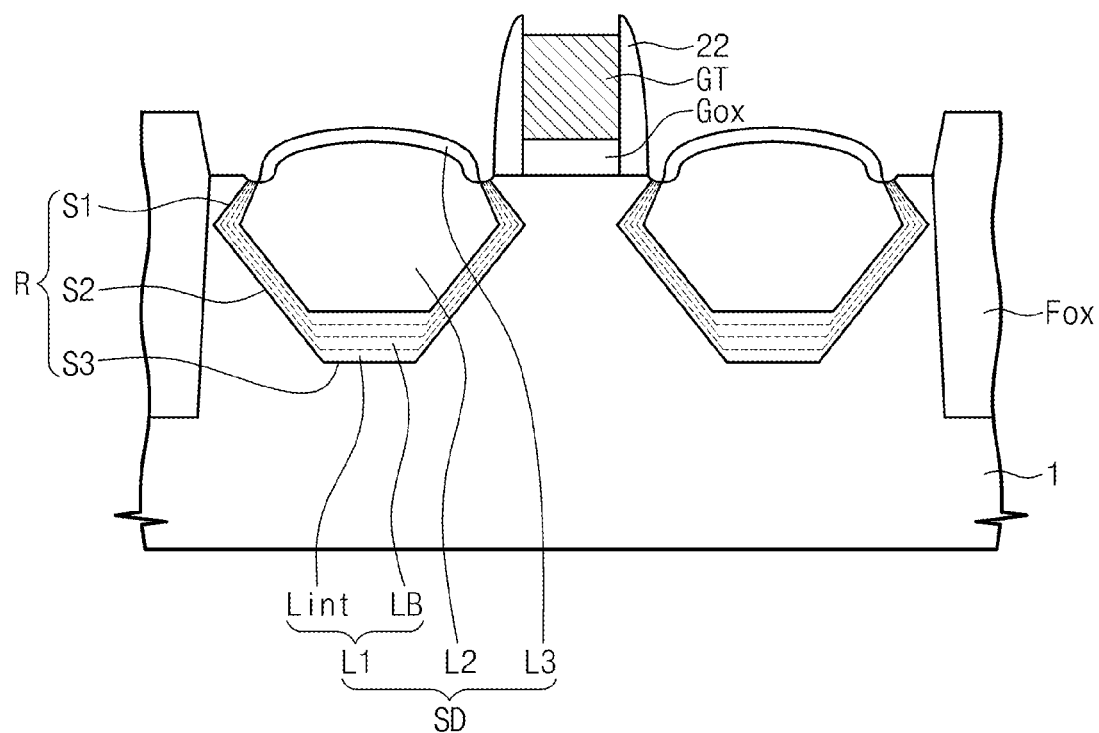

Referring to FIG. 8, the mask pattern M1 is removed. The capping layer 20 can then be removed to expose the gate electrode GT.

Figure 9:
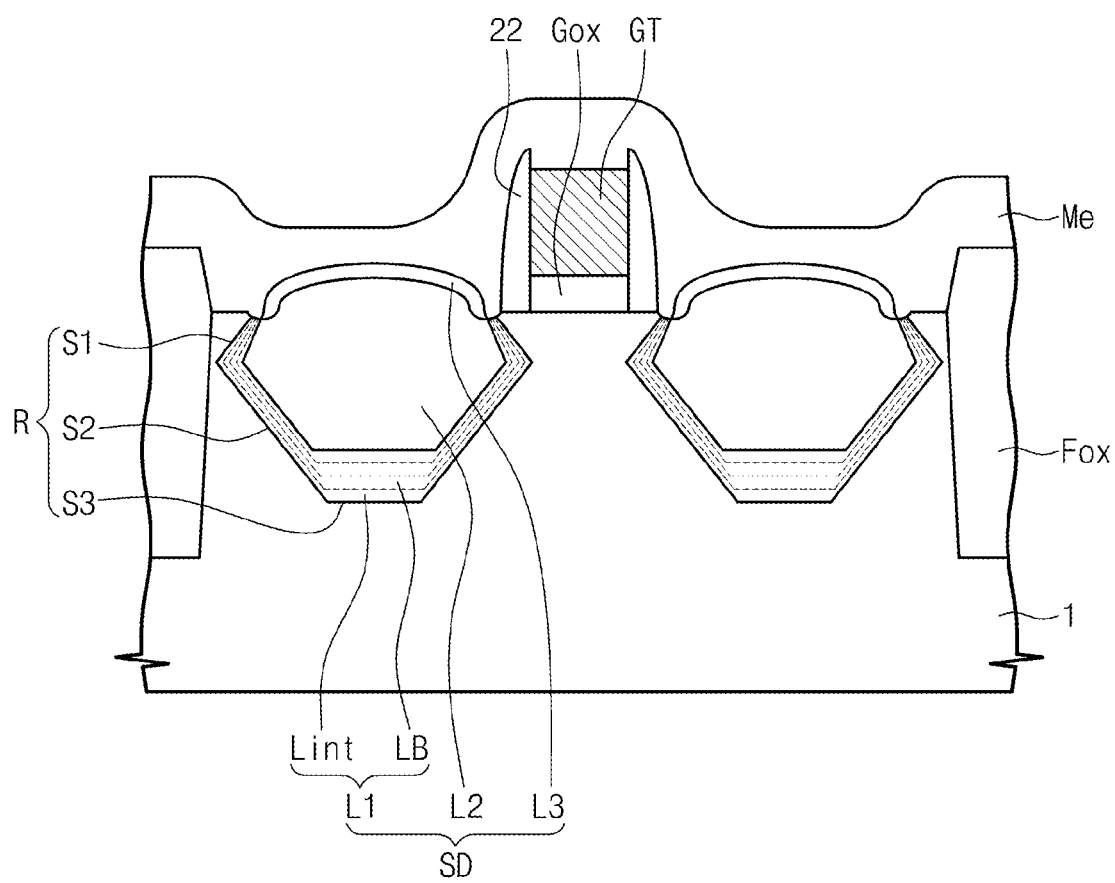

Referring to FIGS. 1 and 9, a metal layer Me is then formed over the entire (upper) surface of the substrate, and then the resulting structure is annealed. As a result of the annealing process, a first silicide layer SC1 is formed on the gate electrode GT and a second silicide layer SC2 is formed on the impurity regions SD. The unreacted part of the metal layer Me is then removed. In addition, during the annealing process, the impurities (e.g., boron atoms) in the second epitaxial layer L2 diffuse into the first sub-epitaxial layer(s) Lint.

The MOS transistor (e.g., a PMOS transistor) according to the inventive concept may be employed by a logic circuit. For example, the PMOS transistor described above may be used in a complementary metal-oxide-semiconductor (CMOS) inverter or a CMOS static random access memory (SRAM) cell.

Figure 10:
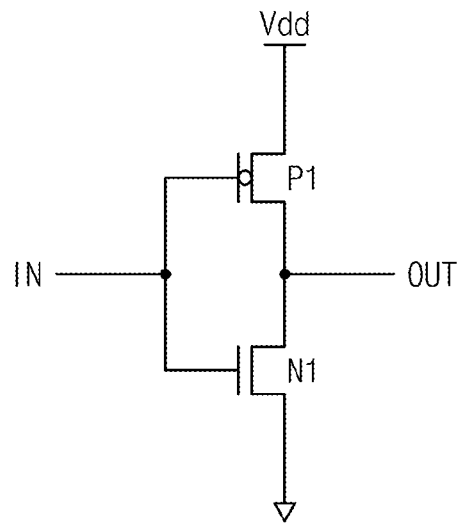
FIG. 10 is an equivalent circuit diagram of an inverter including a P-channel MOS transistor according to the inventive concept.

FIG. 10 is an equivalent circuit diagram of an example of a CMOS inverter including a P-channel MOS transistor according to the inventive concept.

The CMOS inverter includes an NMOS transistor N1 and a PMOS transistor P1 serially connected to each other. More specifically, gates of the NMOS transistor N1 and the PMOS transistor P1 are electrically connected to each other to act as an input terminal of the CMOS inverter, and drains of the NMOS transistor N1 and the PMOS transistor P1 are electrically connected to each other to act as an output terminal of the CMOS inverter. A source of the PMOS transistor P1 is electrically connected to a power supply Vdd, and a source of the NMOS transistor N1 is grounded. The CMOS inverter thus inverts an input signal IN applied to the input terminal of the CMOS inverter, and the inverted signal is outputted through the output terminal of the CMOS inverter. For example, when the input signal has a logic level "1", the output signal may have a logic level "0". On the contrary, when the input signal has a logic level "0", the output signal may have a logic level "1".

Figure 11:
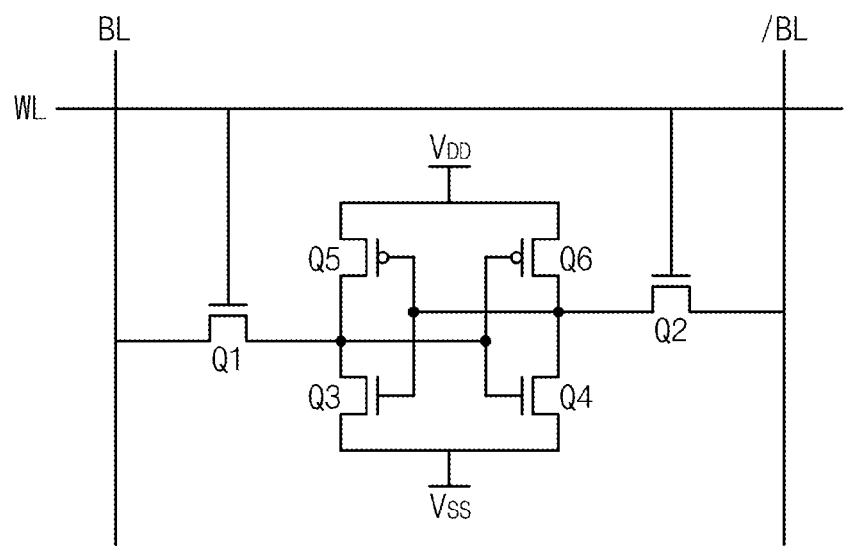
FIG. 11 is an equivalent circuit diagram illustrating a static random access memory (SRAM) cell including a P-channel MOS transistor according to the inventive concept.

FIG. 11 is an equivalent circuit diagram of an example of a CMOS SRAM cell including a P-channel MOS transistor according to the inventive concept.

Referring to FIG. 11, the CMOS SRAM cell includes first and second access transistors Q1 and Q2, first and second driver transistors Q3 and Q4, and first and second load transistors Q5 and Q6. The first and second driver transistors Q3 and Q4 and the first and second access transistors Q1 and Q2 are NMOS transistors, while the first and second load transistors Q5 and Q6 are PMOS transistors. Also, in this example, each of the first and second load transistors Q5 and Q6 is a PMOS transistor according to the inventive concept.

The first driver transistor Q3 and the first access transistor Q1 are serially connected to each other. A source of the first driver transistor Q3 is connected to a ground line Vss, and a drain of the first access transistor Q1 is connected to a first bit line BL. Similarly, the second driver transistor Q4 and the second access transistor Q2 are serially connected to each other. A source of the second driver transistor Q4 is connected to the ground line Vss, and a drain of the second access transistor Q2 is connected to a second bit line /BL.

A source and a drain of the first load transistor Q5 are connected to a power line Vdd and a drain of the first driver transistor Q3, respectively. Similarly, a source and a drain of the second load transistor Q6 are connected to the power line Vdd and a drain of the second driver transistor Q4, respectively. The drain of the first load transistor G5, the drain of the first driver transistor Q3, and the source of the first access transistor Q1 may thus constitute a first node. Similarly, the drain of the second load transistor Q6, the drain of the second driver transistor Q4, and the source of the second access transistor Q2 may constitute a second node. A gate electrode of the first driver transistor Q3 and a gate electrode of the first load transistor Q5 are connected to the second node, and a gate electrode of the second driver transistor Q4 and a gate electrode of the second load transistor Q6 are connected to the first node. Gate electrodes of the first and second access transistors Q1 and Q2 are connected to a word line WL.

Accordingly, the first load transistor Q5 and the first driver transistor Q3 are serially connected to constitute a first inverter, and the second load transistor Q6 and the second driver transistor Q4 are serially connected to constitute a second inverter. Furthermore, the first and second inverters are cross coupled to constitute a latch circuit.

According to the inventive concept as described above, there is provided a MOS transistor including a pair of impurity regions disposed at the sides of a channel region, and a lattice constant of the impurity regions is greater than that of the channel region. Thus, a compressive stress is applied to the channel region and as a result, the channel region has a strained lattice structure. Accordingly, carrier mobility in the channel region is enhanced to facilitate a high speed operation of the MOS transistor.

Furthermore, each of the impurity regions includes a first epitaxial layer, and the first epitaxial layer includes at least one first sub-epitaxial layer formed on sidewalls and a bottom surface of a recessed region of a substrate. That part of the first sub-epitaxial layer formed on the bottom of the recessed region has a relatively low impurity concentration and is thicker than that part of the first sub-epitaxial layer formed on sidewalls of the recessed region. Thus, during an annealing process in the method of fabricating the MOS transistor, the impurities (e.g., boron atoms) in the second epitaxial layer diffuse into the first sub-epitaxial layer(s). Accordingly, the impurity regions may have a graded junction profile in terms of their impurity concentration. Consequently, a junction leakage current of the impurity regions may be minimized.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of fabricating a semiconductor device, the method comprising:
   etching a substrate to form a recess therein;
   forming a first epitaxial layer on interior sidewall surfaces of the substrate delimiting sides of the recess, and a surface of the substrate delimiting the bottom of the recess; and
   sequentially forming a second epitaxial layer and a third epitaxial layer both on the first epitaxial layer,
   wherein the forming of the first epitaxial layer includes sequentially forming, at least one time, a first sub-epitaxial layer and a second sub-epitaxial layer in such a way that a concentration of an impurity of material constituting the first sub-epitaxial layer is less than a concentration of an impurity of material constituting the second sub-epitaxial layer.

2. The method of claim 1, wherein a total time (tmt) it takes to form the first epitaxial layer, a first time (tm1) it takes to form a said first sub-epitaxial layer, a second time (tm2) it takes to form a said second sub-epitaxial layer, and a number (Nr) of times a pair of respective ones of the first and second sub-epitaxial layers is formed, satisfy the following equation:

$$tmt=(tm1+tm2)\times Nr.$$

3. The method of claim 2, wherein a ratio of the second time (tm2) to the first time (tm1) is about 0.01 to about 0.5.

4. The method of claim 1, further comprising forming an additional said first sub-epitaxial layer on a topmost one of the second sub-epitaxial layers in the stack before the second epitaxial layer is formed, and
   wherein a total time (tmt) it takes to form the first epitaxial layer, a first time (tm1) it takes to form a said first sub-epitaxial layer, a second time (tm2) it takes to form a said second sub-epitaxial layer, and a number (Nr) of times a pair of respective ones of the first and second sub-epitaxial layers is formed, satisfy the following equation:

$$tmt=((tm1+tm2)\times Nr)+tm1.$$

5. The method of claim 1, wherein the first epitaxial layer is formed using a modulated in-situ doping technique.

6. The method of claim 1, wherein the forming of the first sub-epitaxial layer comprises supplying ($H_2$), ($GeH_4$), gaseous (HCl) and at least one of ($SiH_2Cl_2$) and ($SiH_4$) into a process chamber in which the substrate is supported.

7. The method of claim 6, wherein the second sub-epitaxial layer is formed by supplying ($H_2$), ($GeH_4$), gaseous (HCl), ($B_2H_6$) and at least one of ($SiH_2Cl_2$) and ($SiH_4$) into the process chamber.

8. A method of fabricating a MOS transistor, the method comprising:
   forming a gate insulating layer and a gate electrode layer on an active region of a substrate;
   etching the active region of the substrate to form recesses therein on opposite sides of a channel region;
   filling the recesses epitaxially with material whose lattice constant is greater than that of the channel region to form source/drain regions on the opposite sides of the channel region, whereby the source/drain regions apply stress to the channel region,
   wherein the filling of the recesses comprises forming a first epitaxial layer that extends along sidewall surfaces delimiting sides of the recesses, and bottom surfaces delimiting the bottoms of the recesses, to such a thickness as to leave upper parts of the recesses unfilled, and
   forming a second epitaxial layer on the first epitaxial layer to such a thickness as to at least fill what remains of the recesses; and
   subsequently annealing the substrate.

9. The method of claim 8, wherein the forming of the first epitaxial layer comprises epitaxially forming a first layer of an intrinsic semiconductor material along the sidewall and bottom surfaces to form a first sub-epitaxial layer, and
   subsequently epitaxially forming a second layer of an intrinsic semiconductor material on the first layer, and doping the second layer with an impurity, to form a second sub-epitaxial layer on the first sub-epitaxial layer and which the second sub-epitaxial layer has a concentration of an impurity greater than that of the first sub-epitaxial layer.

10. The method of claim 9, wherein the forming of the second epitaxial layer comprises epitaxially forming another layer of an intrinsic semiconductor material on the first epitaxial layer, and doping said another layer with an impurity at a concentration greater than that used to form the second sub-epitaxial layer.

11. The method of claim 10, wherein the annealing forms a silicide layer at an upper surface of the gate electrode.

12. The method of claim 10, further comprising:
   epitaxially forming a third epitaxial layer on the second epitaxial layer; and
   forming a metal layer on the third epitaxial layer,
   wherein the annealing forms a silicide layer on the third epitaxial layer.

* * * * *